(12) United States Patent
Ide

(10) Patent No.: US 10,725,430 B2
(45) Date of Patent: Jul. 28, 2020

(54) ATOMIC OSCILLATOR AND MAGNETIC FIELD CONTROL METHOD OF ATOMIC OSCILLATOR

(71) Applicant: Seiko Epson Corporation, Tokyo (JP)

(72) Inventor: Noritaka Ide, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/225,446

(22) Filed: Dec. 19, 2018

(65) Prior Publication Data
US 2019/0204789 A1 Jul. 4, 2019

(30) Foreign Application Priority Data

Dec. 28, 2017 (JP) .................. 2017-254198

(51) Int. Cl.
| | | |
|---|---|---|
| *H01S 1/06* | (2006.01) | |
| *H03B 17/00* | (2006.01) | |
| *G04F 5/14* | (2006.01) | |
| *H03L 7/26* | (2006.01) | |

(52) U.S. Cl.
CPC .............. *G04F 5/145* (2013.01); *H01S 1/06* (2013.01); *H03B 17/00* (2013.01); *H03L 7/26* (2013.01)

(58) Field of Classification Search
CPC .......... G04F 5/145; H01S 1/06; H03B 17/00; H03L 7/26

USPC ..................................... 331/3, 94.1
See application file for complete search history.

(56) References Cited

U.S. PATENT DOCUMENTS

| | | | | |
|---|---|---|---|---|
| 5,670,914 A | * | 9/1997 | Liberman | ................ G04F 5/14 250/251 |
| 2017/0141783 A1 | * | 5/2017 | Tanaka | ................ H01S 5/02296 |

FOREIGN PATENT DOCUMENTS

| | | |
|---|---|---|
| JP | 2015-002447 A | 1/2015 |
| JP | 2015-061091 A | 3/2015 |
| JP | 2017-050665 A | 3/2017 |

* cited by examiner

*Primary Examiner* — Richard Tan
(74) *Attorney, Agent, or Firm* — Harness, Dickey & Pierce, P.L.C.

(57) ABSTRACT

An atomic oscillator includes a light source; an atomic cell in which alkali metal atoms are contained and on which light that is emitted from the light source is incident; a first coil that applies a magnetic field to the atomic cell; a first shield that contains the atomic cell and the first coil and shields a magnetic field; a second shield that includes a first member having a recess and a second member, containing the light source and the first shield in a space which is formed by the first member and the second member, and the second shield shields the magnetic field; and a second coil that generates a magnetic field passing through an opening of the recess.

8 Claims, 12 Drawing Sheets

ATOMIC OSCILLATOR AND MAGNETIC FIELD CONTROL METHOD OF ATOMIC OSCILLATOR

CROSS-REFERENCE TO RELATED APPLICATIONS

This application claims priority to Japanese Patent Application No. 2017-254198, filed Dec. 28, 2017, the entirety of which is hereby incorporated by reference.

BACKGROUND

1. Technical Field

The present invention relates to an atomic oscillator, a frequency signal generation system, and a magnetic field control method of the atomic oscillator.

2. Related Art

An atomic oscillator that oscillates based on energy transition of alkali metal atoms such as rubidium and cesium is known as an oscillator having high accurate oscillation characteristics in the long term. In the atomic oscillator, if an atomic cell is influenced by an external magnetic field (ambient magnetic field), the oscillation characteristics become unstable.

Accordingly, for example, an atomic oscillator disclosed in JP-A-2015-2447 includes a gas cell side magnetic shield unit disposed outside the gas cell, and an outer magnetic shield unit disposed with the gas cell and the gas cell side magnetic shield unit interposed therebetween.

Here, the gas cell side magnetic shield unit includes a plate-shaped base and a bottomed cylindrical lid body, and an opening of the lid body is sealed by the base. Thereby, a space for containing the gas cell is formed. The base and the lid body are formed of a material having a magnetic shielding effect.

In addition, an outer magnetic shield unit includes a bottom portion and a lid, and an opening of the lid is sealed by a substrate. Thereby, a space for containing the gas cell side magnetic shield portion is formed.

In the gas cell side magnetic shield unit, the base and the lid body are bonded together by brazing, seam welding, energy ray welding (laser welding, electron beam welding, and the like), or the like. In addition, there is a case where a bonding member for bonding the base to the lid body is interposed between the base and the lid body.

Accordingly, in the gas cell side magnetic shield unit, magnetoresistance increases at a bonding portion between the base and the lid body. Thus, the gas cell side magnetic shield portion has low magnetic shielding effects against an external magnetic field passing through the lid body through an opening of the lid body from the base, and an external magnetic field passing through the base through an opening of the lid body from the lid body.

In addition, in the outer magnetic shield unit, a substrate exists between a bottom portion and a lid. Accordingly, the bottom portion and the lid are magnetically discontinuous. Thus, the outer magnetic shield unit has low magnetic shielding effects against the magnetic field passing through the lid body through the opening of the lid body from the bottom portion, and the magnetic field passing through the bottom portion through the opening of the lid body from the lid body.

SUMMARY

An advantage of some aspects of the invention is to provide an atomic oscillator capable of reducing an influence of an external magnetic field on an atomic cell. Another advantage of some aspects of the invention is to provide a frequency signal generation system capable of reducing the influence of the external magnetic field on the atomic cell. Still another advantage of some aspects of the invention is to provide a magnetic field control method of the atomic oscillator capable of reducing the influence of the external magnetic field on the atomic cell.

The invention can be implemented as the following embodiments or application examples.

APPLICATION EXAMPLE 1

An atomic oscillator according to this application example includes: a light source; an atomic cell in which alkali metal atoms are contained and on which light that is emitted from the light source is incident; a first coil that applies a magnetic field to the atomic cell; a first shield that contains the atomic cell and the first coil and shields a magnetic field; a second shield that includes a first member having a recess, and a second member, contains the light source and the first shield in a space which is formed by the first member and the second member, and shields the magnetic field; and a second coil that generates a magnetic field passing through an opening of the recess.

Here, there is a low magnetic shielding effect of a second shield against an external magnetic field passing through an opening of a recess from the first member and passing through a second member, and an external magnetic field passing through the opening of the recess from the second member and passing through the first member. In an atomic oscillator according to this application example, since a second coil generates a magnetic field passing through an opening of a recess of a base of the first member, it is possible to reduce the external magnetic field passing through the opening of the recess from the first member and passing through the second member, and the external magnetic field passing through the opening of the recess from the second member and passing through the first member. Thus, in the atomic oscillator according to Application Example 1, it is possible to efficiently reduce an influence of the external magnetic field on the atomic cell.

APPLICATION EXAMPLE 2

In the atomic oscillator according to the application example, the second coil may be disposed outside the first shield.

In an atomic oscillator according to this application example, since a second coil is disposed outside a first shield, a space for disposing the second coil inside the first shield may not be provided. Accordingly, it is possible to reduce a size of the first shield.

APPLICATION EXAMPLE 3

In the atomic oscillator according to the application example, the second coil may be disposed inside the second shield.

In the atomic oscillator according to this application example, since a second coil is disposed inside a second shield, a magnetic field generated by the second coil can be weakened as compared with a case where the second coil is disposed outside the second shield. Thereby, it is possible to reduce power consumption in the atomic oscillator according to the application example.

APPLICATION EXAMPLE 4

In the atomic oscillator according to the application example, the atomic oscillator may further include a multilayer substrate that is contained in the second shield, and the second coil may be disposed in at least two layers of the multilayer substrate.

In the atomic oscillator according to this application example, since a second coil is disposed in at least two layers of a multilayer substrate, it is possible to form a uniform magnetic field in a wide space as compared with a case where the second coil is a single layer coil.

APPLICATION EXAMPLE 5

In the atomic oscillator according to the application example, the second coil may be disposed outside the second shield.

In the atomic oscillator according to this application example, since a second coil is disposed outside a second shield, a space for disposing the second coil inside the second shield may not be formed. Accordingly, it is possible to reduce a size of the second shield.

APPLICATION EXAMPLE 6

In the atomic oscillator according to the application example, the atomic oscillator may further include a magnetic sensor that is disposed inside the second coil and detects the magnetic field.

In the atomic oscillator according to this application example, since a magnetic sensor is disposed inside a second coil, it is possible to detect an accurate magnetic field as compared with a case where the magnetic sensor is disposed outside the second coil.

APPLICATION EXAMPLE 7

A frequency signal generation system according to this application example includes: a light source; an atomic cell in which alkali metal atoms are contained and on which light that is emitted from the light source is incident; a first coil that applies a magnetic field to the atomic cell; a first shield that contains the atomic cell and the first coil and shields a magnetic field; a second shield that includes a first member having a recess, and a second member, contains the light source and the first shield in a space which is formed by the first member and the second member, and shields the magnetic field; and a second coil that generates a magnetic field passing through an opening of the recess.

In the frequency signal generation system according to this application example, since a second coil generates a magnetic field passing through an opening of a recess of a base of a first member, it is possible to reduce an external magnetic field passing through the opening of the recess from the first member and passing through a second member, and an external magnetic field passing through the opening of the recess from the second member and passing through the first member. Thus, it is possible to efficiently reduce an influence of the external magnetic field on an atomic cell in the frequency signal generation system according to this application example.

APPLICATION EXAMPLE 8

A magnetic field control method of an atomic oscillator according to this application example is a magnetic field control method of an atomic oscillator in which the atomic oscillator includes a light source; an atomic cell in which alkali metal atoms are contained and on which the light that is emitted from light source is incident; a first coil that applies a magnetic field to the atomic cell; a first shield that contains the atomic cell and the first coil and shields a magnetic field; a second shield that includes a first member having a recess, and a second member, contains the light source and the first shield in a space which is formed by the first member and the second member, and shields the magnetic field; and a second coil that generates a magnetic field passing through an opening of the recess, and in which the magnetic field control method includes generating a magnetic field passing through the opening of the recess by supplying a current to the second coil; and supplying a current to the first coil in a state where the magnetic field passing through the opening of the recess is generated by the second coil.

In the magnetic field control method of an atomic oscillator according to this application example, since a second coil generates a magnetic field passing through an opening of a recess of a base of a first member, it is possible to reduce an external magnetic field passing through the opening of the recess from the first member and passing through a second member, and an external magnetic field passing through the opening of the recess from the second member and passing through the first member. Thus, it is possible to efficiently reduce an influence of the external magnetic field on an atomic cell in the magnetic field control method of the atomic oscillator according to this application example.

Furthermore, the magnetic field control method of the atomic oscillator according to this application example includes supplying a current to the first coil in a state where a magnetic field passing through the opening of the recess is generated by the second coil, and thus, a magnetic field for Zeeman-splitting an energy level of alkali metal atoms can be applied to the atomic cell by the first coil in a state where the influence of the external magnetic field on the atomic cell is reduced. Thereby, it is possible to increase a frequency stability of the atomic oscillator.

BRIEF DESCRIPTION OF THE DRAWINGS

The embodiments will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. Embodiments which will be described below do not unduly limit the content of the invention described in the appended claims. In addition, all the configurations which will be described below are not essential configuration requirements of the invention.

1. Atomic Oscillator

1.1. Outline

Figure 1:
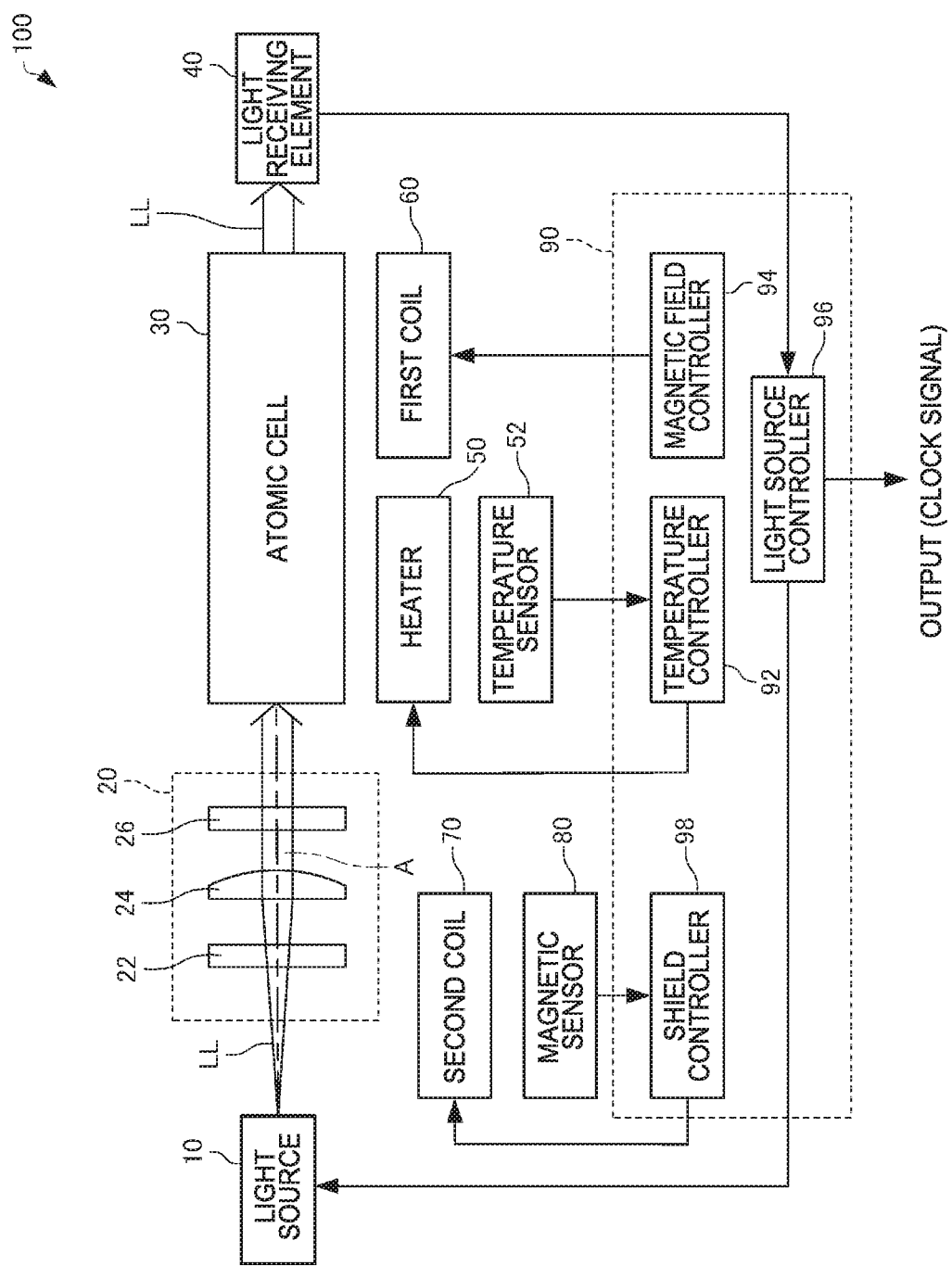
FIG. 1 is a schematic diagram illustrating an atomic oscillator according to an embodiment.

First, an atomic oscillator according to the present embodiment will be described with reference to the drawings. FIG. 1 is a schematic diagram illustrating an atomic oscillator 100 according to the present embodiment.

The atomic oscillator 100 uses a quantum interference effect (CPT: Coherent Population Trapping) in which, when two resonance light beams having specific wavelengths different from alkali metal atoms are simultaneously applied, a phenomenon occurs in which the two resonance light beams transmit the alkali metal atoms without being absorbed. The phenomenon due to the quantum interference effect is also referred to as an electromagnetically induced transparency (EIT) phenomenon. In addition, the atomic oscillator according to the embodiments may be an atomic oscillator using a double resonance phenomenon generated by light and a microwave.

As illustrated in FIG. 1, the atomic oscillator 100 includes a light source 10, an optical system unit 20, an atomic cell 30, a light receiving element 40, a heater 50, a temperature sensor 52, a first coil 60, a second coil 70, a magnetic sensor 80, and a controller 90.

The light source 10 emits linearly polarized light LL including two types of light having different frequencies. The light source 10 is a light emitting element such as a vertical cavity surface Emitting Laser (VCSEL). While not illustrated, a temperature of the light source 10 may be controlled by a temperature control element such as a Peltier element.

The optical system unit 20 is disposed between the light source 10 and the atomic cell 30. The optical system unit 20 includes a dimming filter 22, a lens 24, and a quarter wavelength plate 26.

The dimming filter 22 reduces an intensity of the light LL emitted from the light source 10. The lens 24 adjusts a radiation angle of the light LL. For example, the lens 24 makes the light become LL parallel light. The quarter wavelength plate 26 converts two types of light having different frequencies which are included in the light LL from linearly polarized light to circularly polarized light.

The light LL emitted from the light source 10 transmits through the atomic cell 30. The atomic cell 30 contains alkali metal atoms. The alkali metal atom has an energy level of a three-level system composed of a ground level and an excitation level different from each other. The light LL emitted from the light source 10 is incident on the atomic cell 30 via the dimming filter 22, the lens 24, and the quarter wavelength plate 26.

The light receiving element 40 receives and detects the light LL transmitted through the atomic cell 30. The light receiving element 40 is, for example, a photodiode.

The heater 50 is a temperature control element that controls a temperature of the atomic cell 30. The heater 50 heats the alkali metal atoms contained in the atomic cell 30 to change at least a part of the alkali metal atoms into a gas state. The atomic cell 30 is maintained at, for example, a temperature higher than or equal to 60° C. and a temperature lower than or equal to 70° C. by the heater 50. The temperature sensor 52 detects the temperature of the atomic cell 30.

The first coil 60 applies a magnetic field to the atomic cell 30. Specifically, the first coil 60 applies the magnetic field to the alkali metal atoms contained in the atomic cell 30 in a predetermined direction to cause an energy level of the alkali metal atom to be Zeeman-split.

If the alkali metal atoms are irradiated with a circularly polarized resonance light pair in a state where the alkali metal atoms are Zeeman-split, the number of alkali metal atoms having a desirable energy level among a plurality of Zeeman-split levels is relatively larger than the number of alkali metal atoms having the other energy levels. Accordingly, the number of atoms that develops a desirable EIT phenomenon increases, and a desirable EIT signal increases. As a result, oscillation characteristics of the atomic oscillator 100 can be improved.

The second coil 70 generates a magnetic field in a direction in which an external magnetic field is cancelled. As the second coil 70 generates the magnetic field, an influence of the external magnetic field on the atomic cell 30 can be reduced.

The magnetic sensor 80 outputs information on the magnetic field in the atomic cell 30. Specifically, the magnetic sensor 80 detects the magnetic field at the place where the magnetic sensor 80 is disposed, and outputs the detection result. A magnitude and a direction of the external magnetic field in the atomic cell 30 can be estimated from the detection result of the magnetic field in the magnetic sensor 80.

The controller 90 includes a temperature controller 92, a magnetic field controller 94, a light source controller 96, and a shield controller 98.

The temperature controller 92 controls an electrical connection to the heater 50 such that the interior of the atomic cell 30 has a desirable temperature, based on the detection result of the temperature sensor 52. The magnetic field controller 94 controls a current which is supplied to the first coil 60 such that the magnetic field generated by the first coil 60 is constant.

The light source controller 96 controls frequencies of two types of light included in the light LL emitted from the light source 10 such that the EIT phenomenon occurs, based on the detection result of the light receiving element 40. Here, the EIT phenomenon occurs when the two types of light become a resonance light pair of a frequency difference corresponding to an energy difference between the two ground levels of the alkali metal atoms contained in the atomic cell 30. The light source controller 96 includes a voltage controlled oscillator (not illustrated) whose oscillation frequency is controlled so as to be stabilized in synchronization with a control of frequencies of the two types of lights, and outputs an output signal of the voltage controlled oscillator (VCO) as an output signal (clock signal) of the atomic oscillator 100.

The shield controller 98 supplies a current to the second coil 70. The shield controller 98 controls the current flowing through the second coil 70 so as to generate a magnetic field in a direction in which the second coil 70 cancels the external magnetic field, based on the detection result of the magnetic sensor 80. That is, the shield controller 98 controls the current flowing through the second coil 70 such that the second coil 70 generates a magnetic field in which an influence of the external magnetic field on the atomic cell 30 is reduced.

1.2. Constitution of Atomic Oscillator

Figure 2:
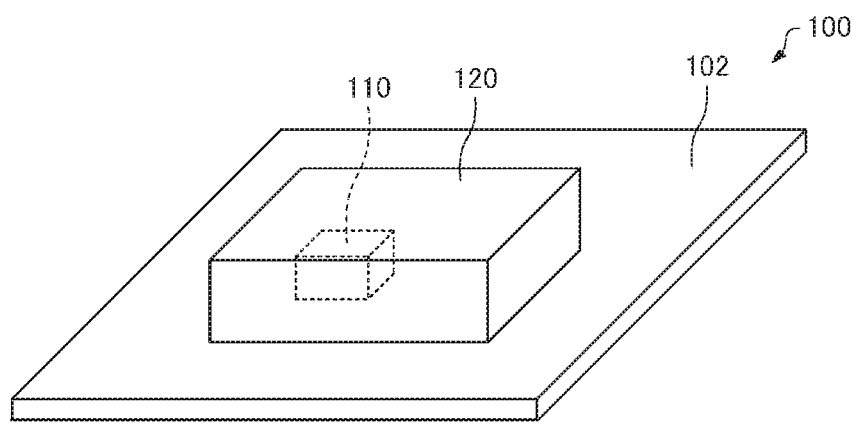
FIG. 2 is a perspective view schematically illustrating the atomic oscillator according to the embodiment.
Figure 3:
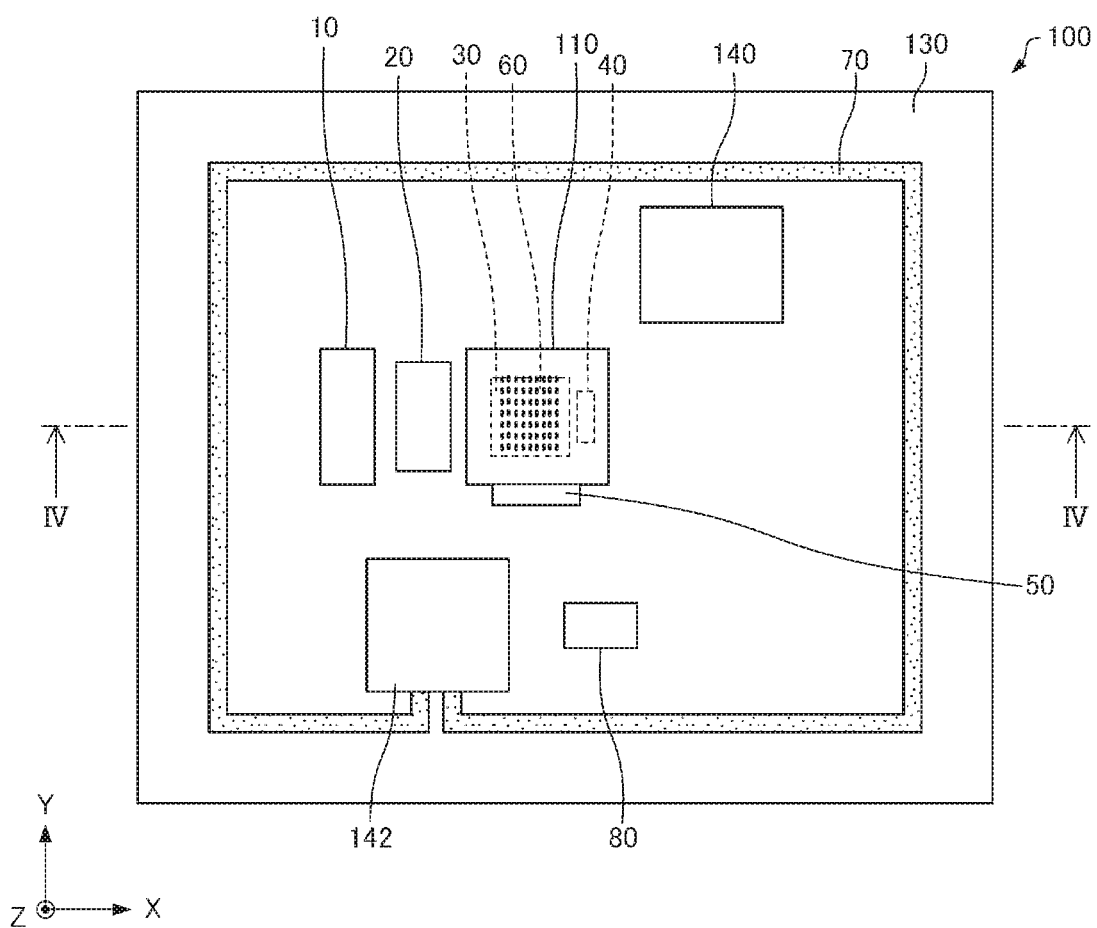
FIG. 3 is a plan view schematically illustrating the atomic oscillator according to the embodiment.
Figure 4:
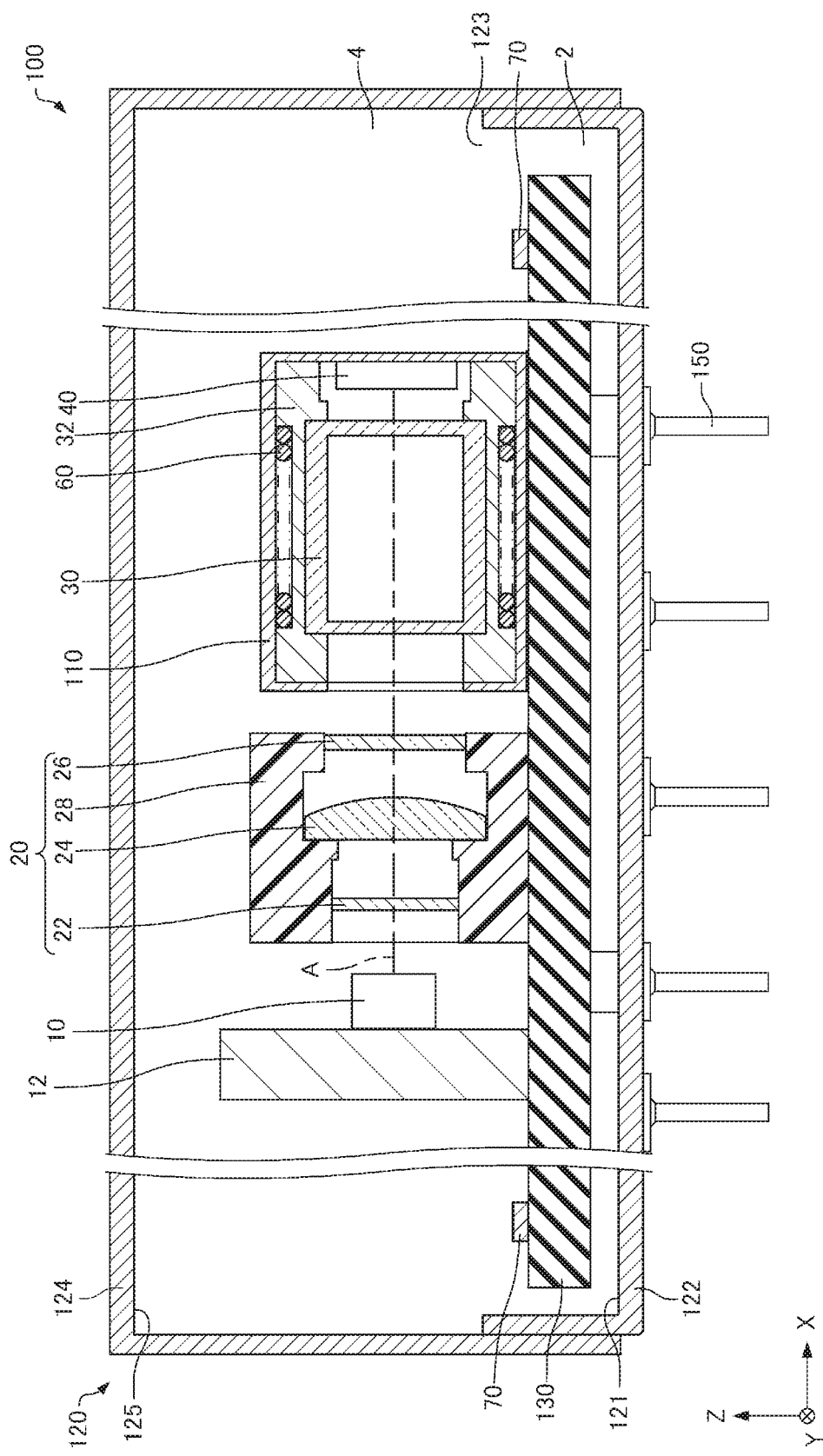
FIG. 4 is a cross-sectional view schematically illustrating the atomic oscillator according to the embodiment.

Next, a configuration of the atomic oscillator 100 will be described. FIG. 2 is a perspective view schematically illustrating the atomic oscillator 100. FIG. 2 briefly illustrates a first shield 110 and a second shield 120 for the sake of convenience. FIG. 3 is a plan view schematically illustrating the atomic oscillator 100. FIG. 4 is a cross-sectional view schematically illustrating the atomic oscillator 100, and is a cross-sectional view taken along line IV-IV of FIG. 3. In FIG. 3, a mounting substrate 102 and the second shield 120 are not illustrated for the sake of convenience. In addition, FIG. 4 does not illustrate the mounting substrate 102 for the sake of convenience.

FIGS. 3 and 4 illustrate an X axis, a Y axis, and a Z axis as three axes orthogonal to each other. Here, the Z axis is an axis along a perpendicular line to a mounting surface of the circuit substrate 130. A +Z axis direction is a direction from a first surface 121 of a base 122 of the second shield 120 to a second surface 125 of a lid 124, and a −Z axis direction is a direction opposite thereto. The X-axis direction is an axis along an optical axis A of the light LL emitted from the light source 10, and the +X-axis direction is a travel direction of the light LL.

As illustrated in FIGS. 2 to 4, the atomic oscillator 100 includes the light source 10, the optical system unit 20, the atomic cell 30, the light receiving element 40, the heater 50, the first coil 60, the second coil 70, the magnetic sensor 80, the mounting substrate 102, the first shield 110, the second shield 120, the circuit substrate 130, and integrated circuit (IC) chips 140 and 142.

The light source 10 is disposed on the circuit substrate 130. In the illustrated example, the light source 10 is fixed to a light source substrate 12, and the light source substrate 12 is fixed to the circuit substrate 130 by a screw (not illustrated). The light source 10 may be disposed directly on the base 122 of the second shield 120 or may be disposed on the base 122 of the second shield 120 via a support member (not illustrated) or the like.

The optical system unit 20 is disposed on the circuit substrate 130. The optical system unit 20 includes the dimming filter 22, the lens 24, the quarter wavelength plate 26, and a holder 28 which holds those. The holder 28 is fixed to the circuit substrate 130 by, for example, a screw (not illustrated). The optical system unit 20 may be disposed directly on the base 122 of the second shield 120 or may be disposed on the base 122 of the second shield 120 via a support member (not illustrated) or the like.

The atomic cell 30 is contained in the first shield 110. The atomic cell 30 is disposed inside the first shield 110. The atomic cell 30 is held by an atomic cell holding member 32 inside the first shield 110. The atomic cell holding member 32 is fixed to the first shield 110 by a screw (not illustrated).

A gaseous alkali metal such as rubidium, cesium, sodium or the like is contained in the atomic cell 30. If necessary, a rare gas such as argon or neon, or an inert gas such as nitrogen may be contained in the atomic cell 30 together with alkali metal atoms as a buffer gas. The light LL emitted from the light source 10 is incident on the atomic cell 30. A material of a wall portion of the atomic cell 30 is, for example, glass or the like.

The light receiving element 40 is contained in the first shield 110. While not illustrated, the light receiving element 40 may be disposed outside the first shield 110.

The heater 50 is provided outside the first shield 110. The heater 50 is disposed, for example, on an outer surface of the first shield 110 via a heat transfer member. The heater 50 is, for example, a heat generation resistor. While not illustrated, the heater 50 may be contained in a shield which shields a magnetic field generated by the heater 50.

While not illustrated in FIGS. 2 to 4, the temperature sensor 52 is disposed near the atomic cell 30. The temperature sensor 52 is, for example, various temperature sensors such as a thermistor and a thermocouple.

The first coil 60 is contained in the first shield 110. The first coil 60 is disposed inside the first shield 110. The first coil 60 is disposed around the atomic cell 30. The first coil 60 is, for example, a solenoid coil wound around an outer circumference of the atomic cell 30, or a pair of Helmholtz type coils facing each other via the atomic cell 30. The first coil 60 generates a magnetic field in a direction along the optical axis A of the light LL inside the atomic cell 30. Thereby, a gap between different degenerate energy levels of alkali metal atoms contained in the atomic cell 30 can be expanded by Zeeman splitting, and thereby, a resolution can be improved and a line width of the EIT signal can be reduced.

The second coil 70 is disposed outside the first shield 110. The second coil 70 is contained in the second shield 120. That is, the second coil 70 is disposed inside the second shield 120. The second coil 70 is provided on the circuit substrate 130.

The second coil 70 is configured by, for example, a wire provided on the circuit substrate 130. Specifically, the second coil 70 is configured by the wire provided on a surface or the inside of the circuit substrate 130. If the circuit substrate 130 is a printed substrate, the second coil 70 is configured by, for example, a printed wire. The configuration of the second coil 70 is not limited to this.

A shape of the second coil 70 viewed from the Z-axis direction is a rectangle. The shape of the second coil 70 viewed from the Z-axis direction is not limited to this, and may be, for example, a circle, an ellipse, or a polygon. The second coil 70 is a single layer coil.

The light source 10, the optical system unit 20, the heater 50, the magnetic sensor 80, the first shield 110, and the IC chips 140, 142 are arranged inside the second coil 70. That is, the light source 10, the optical system unit 20, the heater 50, the magnetic sensor 80, the first shield 110, and the IC chips 140 and 142 are arranged inside the second coil 70 when viewed from the Z-axis direction. At least the atomic cell 30 may be disposed inside the second coil 70.

Figure 5:
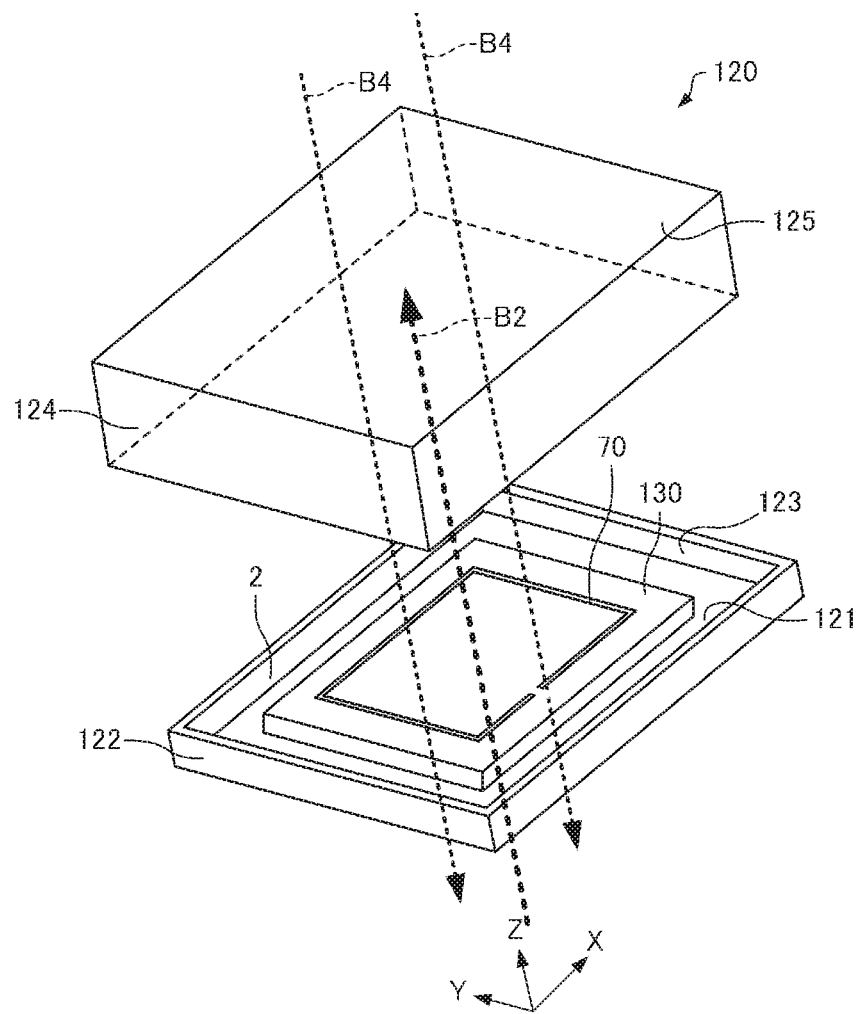
FIG. 5 is a diagram illustrating a magnetic field generated by a second coil.

FIG. 5 is a diagram illustrating the magnetic field generated by the second coil 70. In FIG. 5, only the second coil 70, the second shield 120, and the circuit substrate 130 are illustrated for the sake of convenience. In addition, in FIG. 5, the second coil 70, the second shield 120, and the circuit substrate 130 are briefly illustrated for the sake of convenience.

The second coil 70 generates a magnetic field B2 passing through an opening 123 of a recess 2 provided in the base 122 of the second shield 120. The opening (coil surface) of the second coil 70 faces the Z-axis direction. That is, a perpendicular line to the opening (coil surface) of the second coil 70 is parallel to the Z axis. Thus, a direction of the magnetic field B2 generated by the second coil 70 is the Z-axis direction.

In the illustrated example, the second coil 70 generates the magnetic field B2 in the +Z-axis direction. That is, the second coil 70 generates the magnetic field B2 in a direction from the second coil 70 toward a second surface 125 of the lid 124.

In addition, while not illustrated, by changing a direction of a current flowing through the second coil 70, the second coil 70 can generate the magnetic field B2 in the −Z-axis direction. That is, the second coil 70 can generate the magnetic field B2 in the direction from the second coil 70 toward a first surface 121 of the base 122.

The magnetic field B2 generated by the second coil 70 may have a component of the Z-axis direction inside the second shield 120. That is, the perpendicular line to the opening (coil surface) of the second coil 70 may have the component in the Z-axis direction.

As the second coil 70 generates the magnetic field B2 passing through the opening 123 of the recess 2, the component of the Z-axis direction of an external magnetic field B4 can be reduced in the second shield 120. For example, as illustrated in FIG. 5, as the second coil 70 generates the magnetic field B2 in the +Z-axis direction, it is possible to reduce an influence of the magnetic field (that is, the component of the −Z-axis direction of the external magnetic field) passing through the base 122 from the lid 124 via the opening 123, in the second shield 120.

While not illustrated, as the second coil 70 generates the magnetic field B2 in the −Z-axis direction, it is possible to reduce an influence of the magnetic field (that is, the component of the +Z-axis direction of the external magnetic field) passing through the lid 124 from the base 122 through the opening 123.

Returning to FIGS. 2 to 4, the magnetic sensor 80 is disposed on the circuit substrate 130. The magnetic sensor 80 is disposed inside the second coil 70. That is, the magnetic sensor 80 is located inside the second coil 70 when viewed from the Z-axis direction. The magnetic sensor is disposed outside the first shield 110. Since the first shield 110 and the second shield 120 are formed of a magnetic material, the magnetic field is disturbed in the vicinity thereof. Accordingly, the magnetic sensor 80 is disposed at a predetermined distance from the first shield 110 and the second shield 120.

The magnetic sensor 80 is a sensor for which, for example, a magneto resistive device (MR element), a magnetic impedance element (Magneto Impedance device, MI element), a Hall element, or the like is used. The magnetic sensor 80 may be a uniaxial magnetic sensor or a multiaxial magnetic sensor.

As illustrated in FIG. 2, the second shield 120 is fixed to the mounting substrate 102. The mounting substrate 102 is provided with wires (not illustrated) electrically connected to the IC chips 140 and 142 disposed on the circuit substrate 130. The IC chips 140 and 142 and the wires provided on the circuit substrate 130 are electrically connected to each other through lead pins 150 provided on the circuit substrate 130. In addition, the mounting substrate 102 and the second shield 120 may be fixed by the lead pins 150. Various electronic components (not illustrated) may be provided on the mounting substrate 102. The mounting substrate 102 is, for example, a printed substrate.

The first shield 110 is a container that contains at least the atomic cell 30. In the illustrated example, the first shield 110 contains the atomic cell 30, an atomic cell holding member 32, the light receiving element 40, and the first coil 60. The first shield 110 is disposed on the circuit substrate 130. While not illustrated, the first shield 110 may be disposed directly on the base 122 of the second shield 120 or may be disposed on the base 122 of the second shield 120 via a support member or the like.

The first shield 110 has an outer shape of a substantially rectangle. A material of the first shield 110 is, for example, iron, silicon iron, permalloy, supermalloy, sendust, or the like. By using such a material, the first shield 110 can shield an external magnetic field. Thereby, an influence of the external magnetic field on the atomic cell 30 can be reduced. In the present specification, to "shield the magnetic field" is used to include a case where the magnetic field is completely blocked and a case where an intensity of the magnetic field is reduced.

The first shield 110 is provided with a through hole. The light LL emitted from the light source 10 is incident on the atomic cell 30 through the through hole. A member through which the light LL transmits may be provided in the through hole.

The second shield 120 contains the light source 10, the optical system unit 20, the heater 50, the second coil 70, the magnetic sensor 80, the first shield 110, the circuit substrate 130, and the IC chips 140 and 142. The second shield 120 further contains a temperature sensor 52 (not illustrated in FIGS. 2 to 4). The second shield 120 is fixed to the mounting substrate 102.

The second shield 120 includes the base (an example of a first member) 122 and the lid (an example of a second member) 124 that is a separate body from the base 122. The base 122 includes the recess 2 forming a space for containing the first shield 110 and the like. The opening 123 of the recess 2 provided in the base 122 is closed by the lid 124. In addition, the lid 124 is provided with a recess 4, and the opening of the recess 4 is closed by the base 122. The base 122 and the lid 124 form a space for containing the light source 10, the first shield 110, and the like.

The configuration of the second shield 120 is not limited to this. For example, the base 122 may be flat and the lid 124 may have a recess. As an opening of the recess of the lid 124 is closed by the base 122, a space for containing the first shield 110 and the like may be formed. In addition, for example, the base 122 has a recess, the lid 124 is flat, and the opening of the recess of the base 122 is closed by the lid 124, and thereby, a space for containing the first shield 110 and the like may be formed.

The base 122 and the lid 124 are bonded by, for example, brazing, seam welding, energy ray welding (laser welding, electron beam welding, or the like), or the like. In addition, a bonding member for bonding the base and the lid may be interposed between the base 122 and the lid 124.

The base 122 has the first surface 121. The lid 124 has the second surface 125. The first surface 121 and the second surface 125 face each other. The first surface 121 defines a lower side (−Z-axis direction) of the space in which the first shield 110 and the like are contained. The second surface 125 defines an upper side (+Z-axis direction) of the space in which the first shield and the like are contained.

A material of the second shield 120 is, for example, the same as the material of the first shield 110. Accordingly, the second shield 120 can shield an external magnetic field. Thereby, an influence of the external magnetic field on the atomic cell 30 can be reduced.

A metal having a high electric conductivity may be used as a material of at least one of the first shield 110 and the second shield 120. In this way, by using the metal having a high electric conductivity as the material of the shield, a high frequency magnetic field can be shielded. At least one of the first shield 110 and the second shield 120 may have a two-layer structure of a magnetic material such as permalloy and a metal having a high electric conductivity. In this way, by forming the shield in a two-layer structure, the shield can have a function of shielding a high frequency magnetic field in addition to a function as the magnetic shield.

The circuit substrate 130 is contained in the second shield 120. The circuit substrate 130 is fixed to the base 122 of the second shield 120 via a plurality of lead pins 150. While not illustrated, the circuit substrate 130 is provided with a wire connecting the IC chip 140 to the light source 10, a wire connecting the IC chip 140 to the light receiving element 40, a wire connecting the IC chip 140 to the heater 50, a wire connecting the IC chip 140 to the temperature sensor 52, a wire connecting the IC chip 142 to the second coil 70, a wire connecting the IC chip 142 to the magnetic sensor 80, and the like.

The IC chip 140 is disposed on the circuit substrate 130. The IC chip 140 is disposed inside the second coil 70. The IC chip 140 may be disposed outside the second coil 70. The IC chip 140 includes a circuit functioning as the temperature controller 92, the magnetic field controller 94, and the light source controller 96.

The IC chip 142 is disposed on the circuit substrate 130. The IC chip 142 is disposed inside the second coil 70. The IC chip 142 includes a circuit functioning as a shield controller 98. The circuit functioning as the shield controller 98 may not be incorporated into an IC chip or may be a circuit formed by combining individual elements such as a resistor and a transistor.

The atomic oscillator 100 has, for example, the following characteristics.

In the atomic oscillator 100, the second coil 70 generates the magnetic field B2 that passes through the opening 123 of the recess 2 of the base 122. Accordingly, the atomic oscillator 100 can reduce components of the external magnetic field in the Z-axis direction. Thus, an influence of the external magnetic field on the atomic cell 30 can be reduced. Thereby, it is possible to stabilize oscillation characteristics of the atomic oscillator 100.

Here, in the second shield 120, the base 122 and the lid 124 are separate members, and a magnetoresistance increases at a bonded portion between the base 122 and the lid 124. Accordingly, the second shield 120 has a lower magnetic shielding effect against the magnetic field in the Z-axis direction than, for example, the magnetic field in the X-axis direction and the magnetic field in the Y-axis direction. As described above, in the atomic oscillator 100, an influence of the magnetic field in the Z-axis direction can be reduced by the second coil 70, and thus, an influence of an external magnetic field on the atomic cell 30 can be efficiently reduced.

In order to reduce the influence of the external magnetic field on the atomic cell 30, it is considered that, for example, a shield (hereinafter, also referred to as a "third shield") for containing the first shield 110 is provided inside the second shield 120 instead of the second coil 70. That is, it is conceivable to cover the atomic cell 30 with three shields to shield the external magnetic field. However, if the third shield is provided, it is necessary to form a space for providing the third shield inside the second shield 120, which results in an increase in size of the device. In addition, if the shield is formed by permalloy or the like, annealing is required and a dimensional tolerance increases. Accordingly, if the atomic cell 30 is covered with three shields, an assembly accuracy of the atomic oscillator decreases.

In contrast to this, in the atomic oscillator 100, the third shield may not be provided. Accordingly, the atomic oscillator 100 can be downsized. Particularly, by not providing the third shield, a size in the Z axis direction can be reduced. That is, a height of the atomic oscillator 100 can be reduced. Furthermore, in the atomic oscillator 100, for example, compared with a case where the atomic cell 30 is covered with three shields, an assembly accuracy can be increased.

In addition, permalloy and the like are hard to process, and a material price is also high. In the atomic oscillator 100, an influence of an external magnetic field can be reduced by the second coil 70, and thus, it is possible to reduce the cost as compared with, for example, a case where the atomic cell 30 is covered with three shields.

In the atomic oscillator 100, the second coil 70 is disposed outside the first shield 110. Accordingly, in the atomic oscillator 100, a space for disposing the second coil 70 in the first shield 110 may not be provided, and thus, the first shield 110 can be downsized. Since a size of the second coil 70 is not restricted by a size of the first shield 110, for example, as compared with a case where the second coil 70 is disposed inside the first shield 110, a large coil can be used as the second coil 70.

In the atomic oscillator 100, the second coil 70 is disposed inside the second shield 120. Accordingly, in the atomic oscillator 100, an intensity of the magnetic field B2 generated by the second coil 70 may be an intensity corresponding to the magnetic field that enters the second shield 120. For example, the magnetic field B2 generated by the second coil 70 can be weakened as compared with a case where the second coil 70 is disposed outside the second shield 120. Thereby, power consumption of the atomic oscillator 100 can be reduced.

In the atomic oscillator 100, the second coil 70 is configured by a wire provided on the circuit substrate 130. Accordingly, in the atomic oscillator 100, cost reduction and miniaturization can be achieved. In addition, for example, if a coil configured by a spiral copper wire or the like is used as the second coil 70, it is hard to accurately position a coil on the circuit substrate 130. In contrast to this, in the atomic oscillator 100, the second coil 70 is configured by a wire provided on the circuit substrate 130, and thus, the second coil 70 can be accurately positioned with respect to the circuit substrate 130.

In the atomic oscillator 100, the magnetic sensor 80 is disposed inside the second coil 70. Accordingly, in the atomic oscillator 100, it is possible to accurately detect a magnetic field, for example, as compared with a case where the magnetic sensor 80 is disposed outside the second coil 70.

1.3. Magnetic Field Control Method of Atomic Oscillator

Next, a magnetic field control method of the atomic oscillator 100 will be described.

In the atomic oscillator 100, as the shield controller 98 controls a current (coil current of the second coil 70) supplied to the second coil 70, an influence of an external magnetic field on the atomic cell 30 is reduced. In addition, in the atomic oscillator 100, as the magnetic field controller 94 controls a current supplied to the first coil 60 (coil current of the first coil 60), a magnetic field for Zeeman splitting of an energy level of alkali metal atoms is generated. Hereinafter, processing of the shield controller 98 and processing of the magnetic field controller 94 will be described.

The shield controller 98 controls the coil current of the second coil 70 to generate the magnetic field B2, based on a detection result of the magnetic field by the magnetic sensor 80. The shield controller 98 controls (feedback control) the coil current of the second coil 70 such that a magnitude of an external magnetic field located at the atomic cell 30 becomes a target value (for example, a magnitude of the magnetic field is zero).

The shield controller 98 controls the coil current of the second coil 70, for example, by a proportional integral differential Controller (PID control). For example, the shield controller 98 first obtains a magnetic field located at the atomic cell 30 from an output signal of the magnetic sensor 80, by using a table in which the output signal and the magnetic field located at the atomic cell 30 are associated with each other. Next, a difference between the magnitude of the magnetic field located at the atomic cell 30 and the target value is PID-computed, and the coil current of the second coil 70 is adjusted based on the computation result. Thereby, even if the external magnetic field alters (for example, an alternating magnetic field or the like), an influence of the external magnetic field on the atomic cell 30 can be reduced.

Here, the magnetic sensor 80 detects not only an external magnetic field but also a magnetic field generated by the first coil 60. Accordingly, a relationship between an output signal of the magnetic sensor 80 and a magnetic field located at the atomic cell 30 changes between a state where the first coil 60 does not generate the magnetic field and a state where the first coil 60 generates the magnetic field. Thus, a table (hereinafter, referred to as a "first table") in a state where the first coil 60 does not generate the magnetic field and a table (hereinafter, referred to as a "second table") in a state where the first coil 60 generates the magnetic field are used as a table associating the output signal of the magnetic sensor 80 and the magnetic field located at the atomic cell 30. The first table and the second table are stored, for example, in a storage device (memory) mounted on the IC chip 142.

The magnetic field controller 94 controls a current supplied to the first coil 60 to generate a magnetic field inside the atomic cell 30 in a direction along the optical axis A of the light LL. Thereby, a gap between different degenerate energy levels of alkali metal atoms contained in the atomic cell 30 can be expanded by Zeeman splitting, and thereby, a resolution can be improved and a line width of the EIT signal can be reduced. As a result, a frequency stability can be increased in the atomic oscillator 100. For example, the magnetic field controller 94 controls a coil current of the first coil 60 such that the magnetic field generated by the first coil 60 is constant.

A control of supplying a current to the first coil 60 by using the magnetic field controller 94 is performed in a state where the second coil 70 is controlled by the shield controller 98. That is, as illustrated in FIG. 5, the current is supplied to the first coil 60 in a state where the magnetic field B2 passing through the opening 123 of the recess 2 of the base 122 is generated by the second coil 70. Accordingly, a magnetic field for causing Zeeman splitting of the energy level of the alkali metal atoms can be applied to the atomic cell 30 in a state where an influence of an external magnetic field on the atomic cell 30 is reduced.

Figure 6:
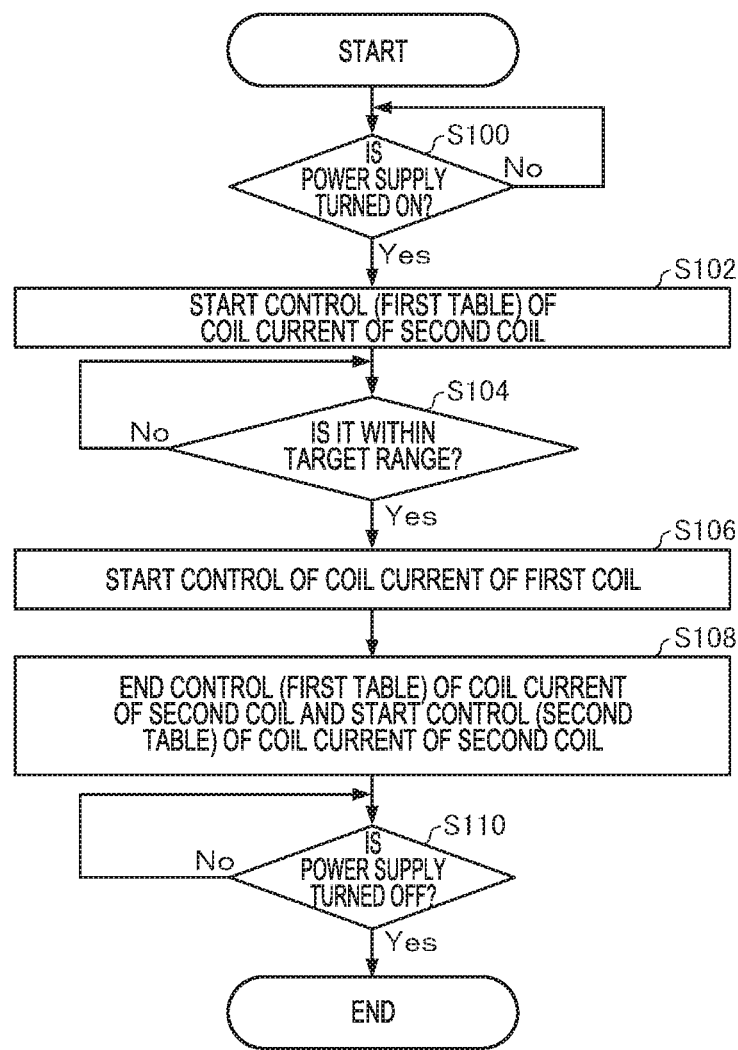
FIG. 6 is a flowchart illustrating an example of processing of a shield controller and a magnetic field controller.

FIG. 6 is a flowchart illustrating an example of processing by the shield controller 98 and the magnetic field controller 94. FIG. 6 illustrates a flow of processing when the shield controller 98 performs a feedback control.

First, the shield controller 98 stands by until a power supply is turned on (No in S100), and if the power supply is turned on (Yes in S100), the shield controller 98 obtains a magnetic field located at the atomic cell 30 from an output signal of the magnetic sensor 80 by using the first table, and starts processing of controlling a coil current of the second coil 70 such that a magnitude of the magnetic field located at the atomic cell 30 reaches a target value (S102).

The shield controller 98 determines whether or not the magnitude of the magnetic field located at the atomic cell 30 is within a target range, based on the output signal of the magnetic sensor 80 (S104). If it is determined that the magnitude of the magnetic field located at the atomic cell 30 is not within the target range (No in S104), the shield controller 98 again determines whether or not the magnitude of the magnetic field located at the atomic cell 30 is within the target range.

If it is determined that the magnitude of the magnetic field located at the atomic cell 30 is within the target range (Yes in S104), the light source controller 96 controls frequencies of two types of light included in the light LL emitted from the light source 10 such that the EIT phenomenon occurs, based on the detection result of the light receiving element 40, and the magnetic field controller 94 starts the processing of controlling a coil current of the first coil 60 (S106).

The magnetic field controller 94 controls the current supplied to the first coil 60 such that the magnetic field generated by the first coil 60 is constant. The magnetic field controller 94 supplies a predetermined coil current to the first coil 60 so as to expand a gap between different degenerate energy levels of alkali metal atoms contained in the atomic cell 30 by using the Zeeman splitting, and thereby, the line width of the EIT signal can be reduced.

Next, the shield controller 98 obtains the magnetic field located at the atomic cell 30 from the output signal of the magnetic sensor 80 by using the first table, ends the processing of controlling the coil current of the second coil 70, obtains the magnetic field located at the atomic cell 30 from the output signal of the magnetic sensor by using the second table, and starts processing of controlling the coil current of the second coil 70 such that the magnitude of the magnetic field located at the atomic cell 30 reaches a target value (S108).

A control of the coil current of the second coil 70 performed by the shield controller 98 and a control of the coil current of the first coil 60 performed by the magnetic field controller 94 are performed until an operation to turn off the power is performed (No in S110), and if the operation to turn off the power is performed (Yes in S110), the processing ends.

In the above description, a case where the shield controller 98 performs a feedback control is described, but the shield controller 98 may determine the coil current of the second coil 70, based on the output signal of the magnetic sensor 80, for example, at a certain time and may continue to supply the determined coil current to the second coil 70. That is, the shield controller 98 may make the coil current of the second coil 70 constant (constant control).

In the constant control, for example, in a state where the first coil 60 does not generate a magnetic field, the magnetic sensor 80 detects the magnetic field and determines the coil current of the second coil 70, based on the detection result. At this time, the coil current of the second coil 70 is determined based on the first table. In the constant control, a constant coil current is supplied to the second coil 70, and thereby, an intensity of the magnetic field generated by the second coil 70 is constant. Accordingly, compared to, for example, a case where a feedback control is performed, an influence of the magnetic field generated by the second coil 70 on the atomic cell 30 is small.

Since an alternating magnetic field cannot be canceled under the constant control, a metal having a high electric conductivity may be used as a material of at least one of the first shield 110 and the second shield 120. At least one of the first shield 110 and the second shield 120 may be coated with the metal having a high electric conductivity. Thereby, even if the constant control is performed, an influence of the alternating magnetic field on the atomic cell 30 can be reduced.

Figure 7:
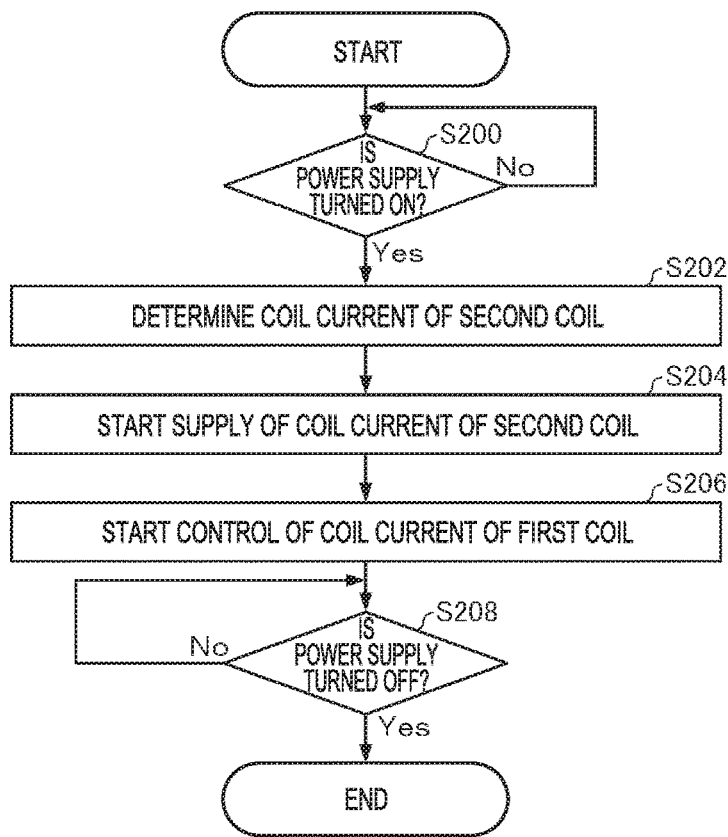
FIG. 7 is a flowchart illustrating an example of the processing of the shield controller and the magnetic field controller.

FIG. 7 is a flowchart illustrating an example of processing of the shield controller 98 and the magnetic field controller 94. FIG. 7 illustrates a flow of processing when the shield controller 98 performs a constant control.

First, the shield controller 98 stands by until a power supply is turned on (No in S200), and if the power supply is turned on (Yes in S200), the shield controller 98 obtains a magnetic field located at the atomic cell 30 from an output signal of the magnetic sensor 80 by using the first table and determines a coil current of the second coil 70 such that a magnitude of the magnetic field located at the atomic cell 30 reaches a target value (S202).

Next, the shield controller 98 starts a control of supplying the determined coil current to the second coil 70 (S204). Thereby, a constant coil current is supplied to the second coil 70, and an intensity of the magnetic field generated by the second coil 70 is constant.

Next, the light source controller 96 controls frequencies of two types of light included in the light LL emitted from the light source 10 such that the EIT phenomenon occurs, based on the detection result of the light receiving element 40, and the magnetic field controller 94 starts processing of controlling the coil current of the first coil 60 (S206).

The processing of step S206 is performed in the same manner as the processing of step S106.

A control of the coil current of the second coil 70 performed by the shield controller 98 and a control of the coil current of the first coil 60 performed by the magnetic field controller 94 are performed until an operation to turn off the power is performed (No in S208), and when the operation to turn off the power is performed (Yes in S208), the processing ends.

The magnetic field control method of the atomic oscillator 100 has, for example, the following characteristics.

The magnetic field control method of the atomic oscillator 100 includes supplying a current to the second coil 70 to generate the magnetic field B2 passing through the opening 123 of the recess 2 of the base 122, and supplying a current to the first coil 60 in a state where generating the magnetic field B2 is completed. Accordingly, in a state where an influence of an external magnetic field on the atomic cell 30 is reduced, a magnetic field for causing the Zeeman splitting of an energy level of alkali metal atoms performed by the first coil 70 can be applied to the atomic cell 30. Thereby, a frequency stability of the atomic oscillator 100 can be increased.

1.4. Modification Example

Next, a modification example of the atomic oscillator according to the present embodiment will be described. Hereinafter, in the modification example of the atomic oscillator according to the present embodiment, a point different from the example of the atomic oscillator 100 described above will be described, and description on the same point will be omitted.

1.4.1. First Modification Example

Figure 8:
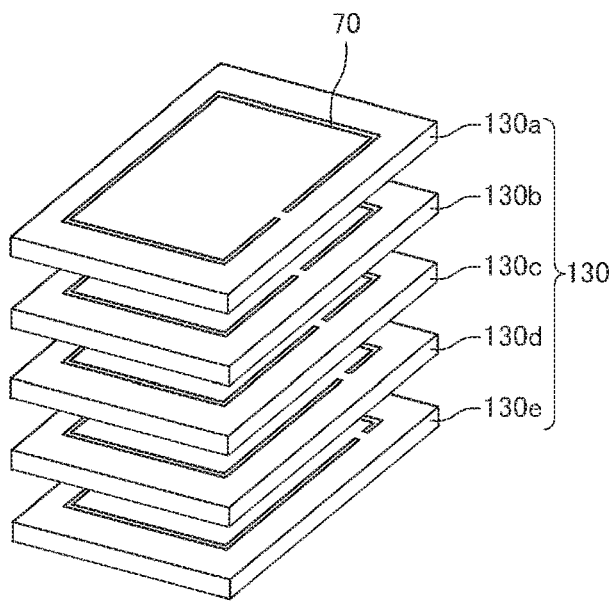
FIG. 8 is a perspective view schematically illustrating a second coil of an atomic oscillator according to a first modification example.

First, an atomic oscillator according to a first modification example will be described with reference to the drawings. FIG. 8 is a perspective view schematically illustrating the second coil 70 of an atomic oscillator according to the first modification example.

As illustrated in FIGS. 3 to 5, in the atomic oscillator 100 described above, the second coil 70 is a single layer coil. In contrast to this, in the atomic oscillator according to the first modification example, the circuit substrate 130 is a multilayer substrate, and the second coil 70 is a multilayer coil provided in a plurality of substrates 130a, 130b, 130c, 130d, and 130e configuring the circuit substrate 130, as illustrated in FIG. 8.

The circuit substrate 130 is a multilayer substrate obtained by stacking the substrate 130a, the substrate 130b, the substrate 130c, the substrate 130d, and the substrate 130e. Here, the number of layers of the circuit substrate 130 is five, but the number of layers thereof is not limited in particular.

The second coils 70 are arranged on the substrates 130a, 130b, 130c, 130d, and 130e, respectively. The second coils 70 are configured by wires arranged on the substrates 130a, 130b, 130c, 130d, and 130e. For example, the wire disposed on the substrate 130a and the wire disposed on the substrate 130b are electrically connected by a through-electrode (not illustrated) provided on the substrate 130a. In this way, the wires arranged on the adjacent substrates are electrically connected by through-electrodes.

In the illustrated example, the second coils 70 are disposed in all layers of the circuit substrate 130 but may be disposed in at least two layers of the circuit substrate 130.

In the atomic oscillator according to the first modification example, an influence of an external magnetic field on the atomic cell 30 can be reduced in the same manner as the atomic oscillator 100 described above. Furthermore, in the atomic oscillator according to the first modification example, the second coils 70 are disposed in at least two layers of the circuit substrate 130 which is a multilayer substrate. Accordingly, in the atomic oscillator according to the first modification example, the second coil 70 can be configured by a solenoid. Thus, a uniform magnetic field can be formed in a wide space, for example, as compared with a case where the second coil 70 is a single layer coil. In addition, in the atomic oscillator according to the first modification example, a size thereof can be reduced, for example, as compared with a case where a solenoid coil configured by a spiral copper wire or the like is disposed on the circuit substrate 130.

Figure 9:
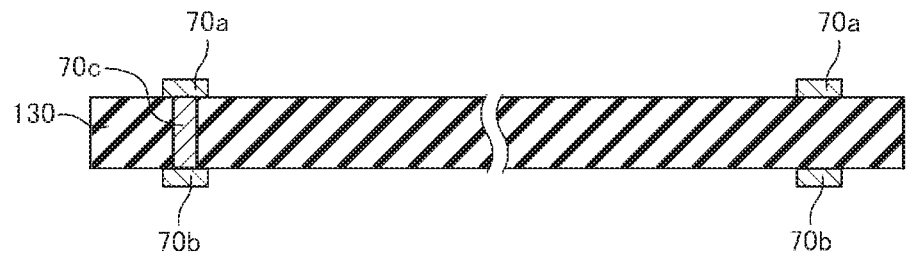
FIG. 9 is a cross-sectional view schematically illustrating another example of the second coil of the atomic oscillator according to the first modification example.

FIG. 9 is a cross-sectional view schematically illustrating another example of the second coil 70 of the atomic oscillator according to the first modification example.

The second coil 70 may include a wire 70*a* provided on an upper surface of the circuit substrate 130, a wire 70*b* provided on a lower surface of the circuit substrate 130, and a through-electrode 70*c* which is provided on the circuit substrate 130 and connects the wire 70*a* to the wire 70*b*. Thereby, it is possible to provide the second coil 70 of two layers in one circuit substrate 130.

1.4.2. Second Modification Example

Figure 10:
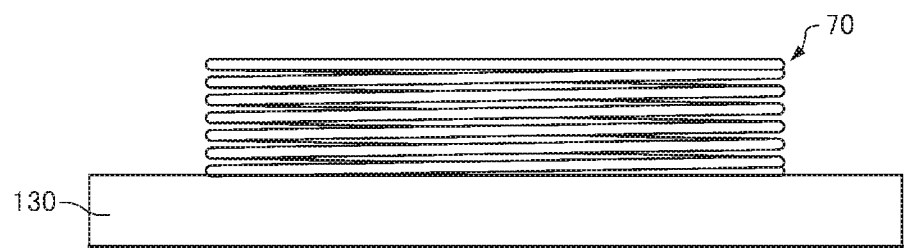
FIG. 10 is a side view schematically illustrating a circuit substrate and a second coil of an atomic oscillator according to a second modification example.
Figure 11:
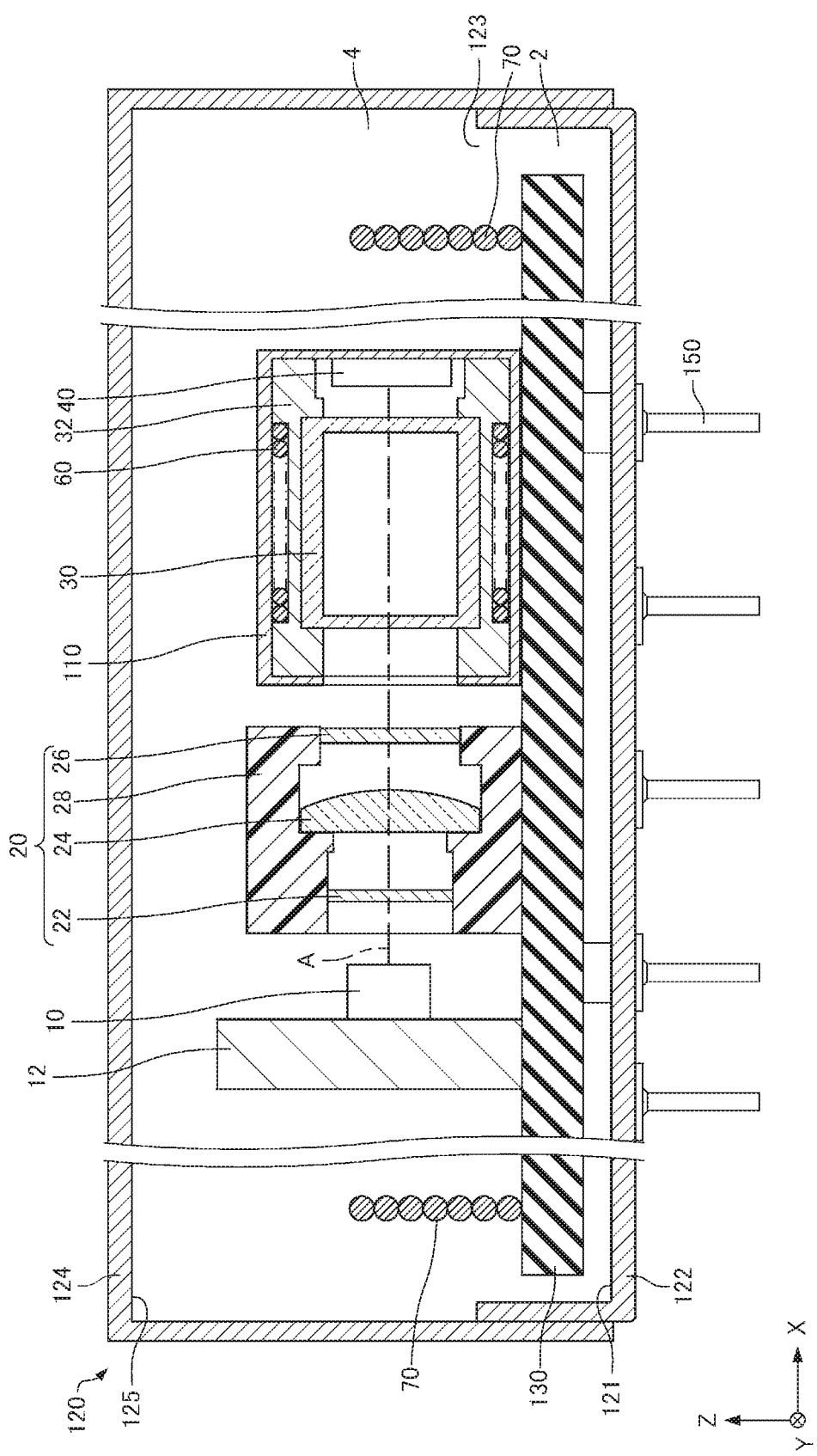
FIG. 11 is a cross-sectional view schematically illustrating an atomic oscillator according to a second modification example.

Next, an atomic oscillator according to a second modification example will be described with reference to the drawings. FIG. 10 is a side view schematically illustrating the circuit substrate 130 and the second coil of the atomic oscillator according to the second modification example. FIG. 11 is a cross-sectional view schematically illustrating the atomic oscillator according to the second modification example. FIG. 11 corresponds to FIG. 4.

As illustrated in FIG. 4, in the atomic oscillator 100 described above, the second coil 70 is configured by a wiring provided on the circuit substrate 130. In contrast to this, in the atomic oscillator according to the second modification example, the second coil 70 is configured by a solenoid coil disposed on the circuit substrate 130, as illustrated in FIGS. 10 and 11.

The second coil 70 is, for example, a coil configured by a spiral copper wire or the like. A shape of the second coil 70 viewed from the Z-axis direction is not limited in particular, and may be, for example, a rectangle, a circle, an ellipse, or the like.

In the illustrated example, the light source 10, the optical system unit 20, the heater 50, the magnetic sensor 80, the first shield 110, and the IC chips 140 and 142 are arranged inside the second coil 70. At least the atomic cell 30 may be disposed inside the second coil 70.

In the atomic oscillator according to the second modification example, an influence of an external magnetic field on the atomic cell 30 can be reduced in the same manner as in the atomic oscillator 100 described above.

1.4.3. Third Modification Example

Figure 12:
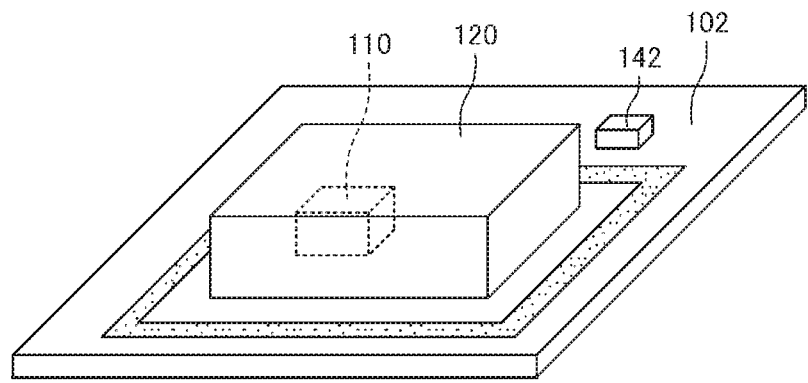
FIG. 12 is a perspective view schematically illustrating an atomic oscillator according to a third modification example.

Next, an atomic oscillator according to a third modification example will be described with reference to the drawings. FIG. 12 is a perspective view schematically illustrating the atomic oscillator according to the third modification example. FIG. 12 corresponds to FIG. 2.

As illustrated in FIGS. 2 to 4, in the atomic oscillator 100 described above, the second coil 70 is disposed inside the second shield 120. In contrast to this, in the atomic oscillator according to the third modification example, the second coil 70 is disposed outside the second shield 120 as illustrated in FIG. 12.

In the illustrated example, the second coil 70 is disposed on the mounting substrate 102. The second coil 70 surrounds the second shield 120. When viewed from the Z-axis direction, the second shield 120 is disposed inside the second coil 70.

While not illustrated, the second coil 70 disposed on the mounting substrate 102 may be a solenoid coil (see FIG. 10) configured by a spiral copper wire or the like.

The IC chip 142 functioning as the shield controller 98 is disposed outside the second shield 120. Here, the IC chip 142 is for power supply of the second coil 70, and a relatively large magnetic field is generated from the IC chip 142. By disposing the IC chip 142 outside the second shield 120, an influence of the magnetic field generated by the IC chip 142 on the atomic cell 30 can be reduced.

In the atomic oscillator according to the third modification example, an influence of an external magnetic field on the atomic cell 30 can be reduced in the same manner as in the atomic oscillator 100 described above. Furthermore, in the atomic oscillator according to the third modification example, the second coil 70 is disposed outside the second shield 120, and thus, a space for disposing the second coil 70 may not be formed inside the second shield 120. Accordingly, it is possible to reduce a size of, for example, the second shield 120. In addition, since the size of the second coil 70 is not limited by the size of the second shield 120, for example, a large coil can be used as the second coil 70, as compared with a case where the second coil 70 is disposed inside the second shield 120.

Furthermore, in the atomic oscillator according to the third modified example, the IC chip 142 that supplies a current to the second coil 70 is disposed outside the second shield 120, and thus, an influence of the magnetic field generated by the IC chip 142 on the atomic cell 30 can be reduced.

1.4.4. Fourth Modification Example

Figure 13:
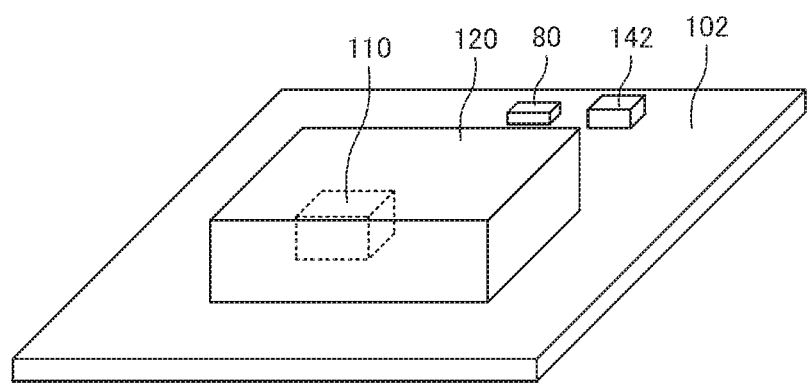
FIG. 13 is a perspective view schematically illustrating an atomic oscillator according to a fourth modification example.

Next, an atomic oscillator according to a fourth modification example will be described with reference to the drawings. FIG. 13 is a perspective view schematically illustrating the atomic oscillator according to the fourth modification example. FIG. 13 corresponds to FIG. 2.

As illustrated in FIGS. 2 to 4, in the atomic oscillator 100 described above, the IC chip 142 and the magnetic sensor 80 functioning as the shield controller 98 are disposed inside the second shield 120. In contrast to this, in the atomic oscillator according to the fourth modification example, the IC chip 142 and the magnetic sensor 80 are disposed outside the second shield 120 as illustrated in FIG. 12.

The IC chip 142 and the magnetic sensor 80 are disposed on the mounting substrate 102. While not illustrated, the IC chip 142 may be disposed outside the second shield 120, and the magnetic sensor 80 may be disposed inside the second shield 120.

In the atomic oscillator according to the fourth modification example, an influence of an external magnetic field on the atomic cell 30 can be reduced in the same manner as in the atomic oscillator 100 described above. Furthermore, in the atomic oscillator according to the fourth modification example, the IC chip 142 and the magnetic sensor 80 are disposed outside the second shield 120, and thus, a space for disposing the IC chip 142 and the magnetic sensor 80 may not be formed inside the second shield 120. Accordingly, for example, it is possible to reduce a size of the second shield 120. In addition, by disposing the IC chip 142 outside the second shield 120, an influence of a magnetic field generated by the IC chip 142 on the atomic cell 30 can be reduced.

1.4.5. Fifth Modification Example

Figure 14:
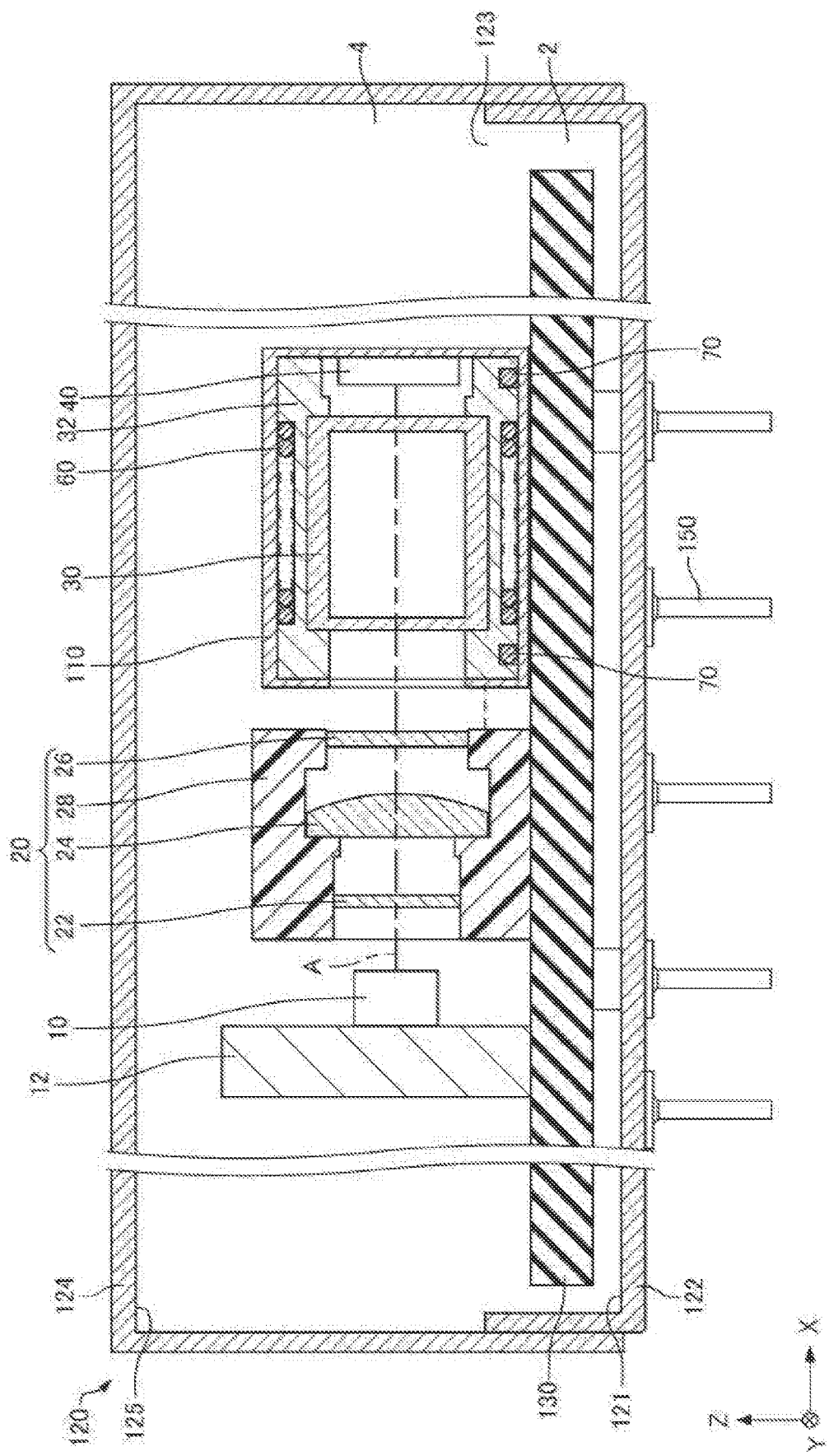
FIG. 14 is a cross-sectional view schematically illustrating an atomic oscillator according to a fifth modification example.

Next, an atomic oscillator according to a fifth modification example will be described with reference to the drawings. FIG. 14 is a cross-sectional view schematically illustrating the atomic oscillator according to the fifth modification example. FIG. 14 corresponds to FIG. 4.

As illustrated in FIG. 4, in the atomic oscillator 100 described above, the second coil 70 is disposed outside the first shield 110.

In contrast to this, in the atomic oscillator according to the fifth modification example, the second coil 70 is disposed inside the first shield 110 as illustrated in FIG. 14.

The second coil 70 is provided in the atomic cell holding member 32. The second coil 70 is, for example, a single layer coil in which a copper wire or the like is formed in a circular shape or a rectangular shape. A coil configured by a spiral copper wire or the like may be used as the second coil 70.

In the illustrated example, the light source 10 and the optical system unit 20 are disposed outside the second coil 70, and the atomic cell 30 is disposed inside the second coil 70.

In the atomic oscillator according to the fifth modification example, the second coil 70 is disposed inside the first shield 110. Accordingly, for example, the magnetic field B2 generated by the second coil 70 can be weakened as compared with, for example, a case where the second coil 70 is disposed outside the first shield 110. Thereby, power consumption of the atomic oscillator can be reduced.

In the atomic oscillator according to the fifth modification example, the second coil 70 is disposed inside the first shield 110. For example, it is conceivable to cover the atomic cell 30 with three shields in order to reduce the influence of the external magnetic field on the atomic cell 30, but in the atomic oscillator according to the fifth modification example, an innermost shield (that is, a shield closest to the atomic cell 30) of the three shields may not be provided. Accordingly, in the atomic oscillator according to the fifth modification example, miniaturization and reduction in height can be achieved. Furthermore, in the atomic oscillator according to the fifth modification example, an assembly accuracy can be improved.

1.4.6. Sixth Modification Example

Figure 15:
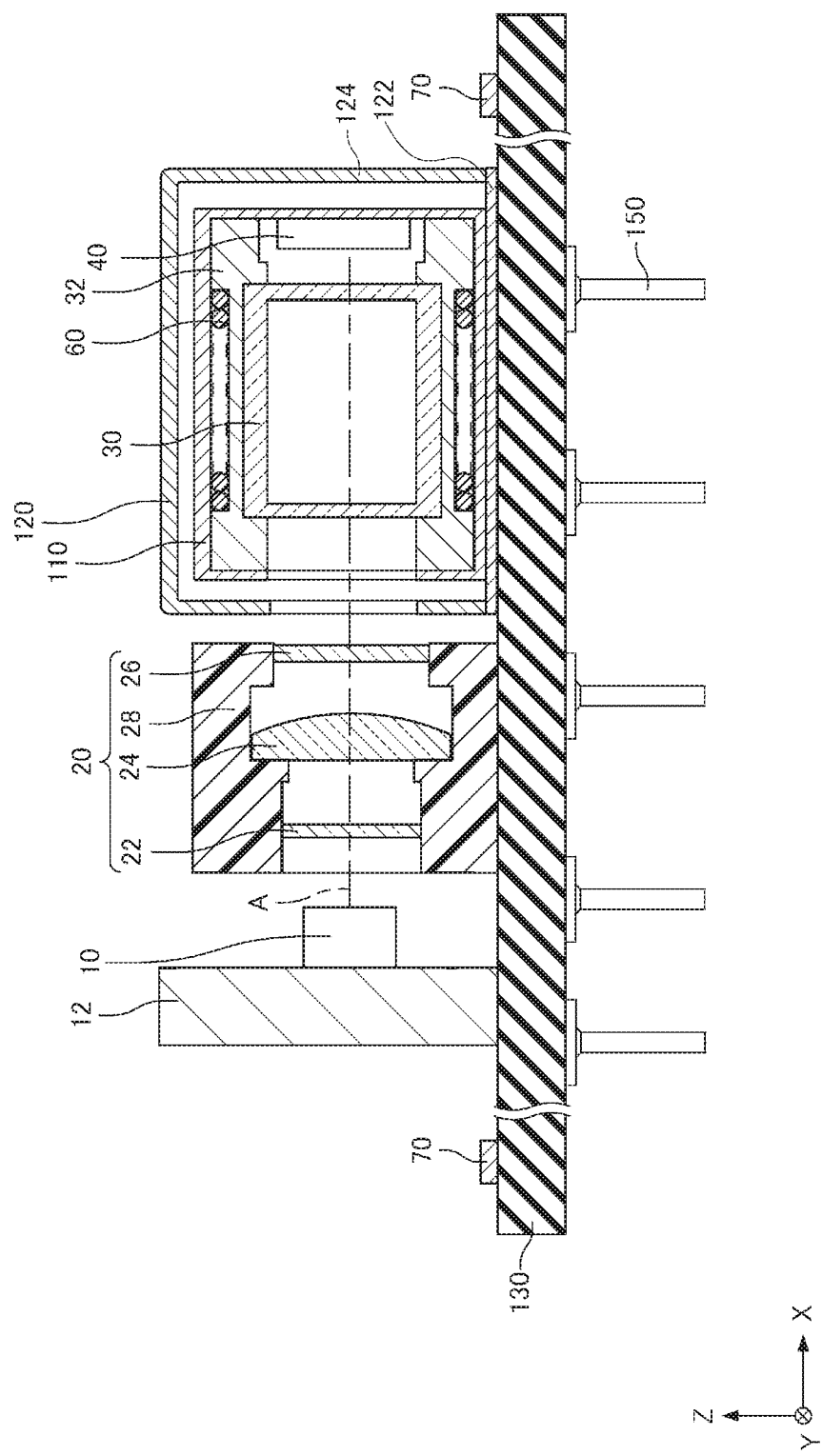
FIG. 15 is a cross-sectional view schematically illustrating an atomic oscillator according to a sixth modification example.

Next, an atomic oscillator according to a sixth modification example will be described with reference to the drawings. FIG. 15 is a cross-sectional view schematically illustrating the atomic oscillator according to the sixth modification example. FIG. 15 corresponds to FIG. 4.

As illustrated in FIG. 4, in the atomic oscillator 100 described above, the second coil 70 is disposed inside the second shield 120.

In contrast to this, in the atomic oscillator 100, the second coil 70 is disposed outside the second shield 120 as illustrated in FIG. 15.

In the illustrated example, the second shield 120 includes the base 122 which is flat and the lid 124 having a recess. By closing an opening of the recess of the lid 124 with the base 122, a space for containing the first shield 110 and the like is formed.

The second shield 120 is provided so as to cover only the first shield 110. That is, the first shield 110, the atomic cells 30 contained in the first shield 110, and the like are disposed inside the second shield 120, and the light source 10 and the like which are not contained in the first shield 110 are not disposed inside the second shield 120. A through hole is provided in the second shield 120. The light LL emitted from the light source 10 is incident on the atomic cell 30 through the through hole of the second shield 120 and the through hole of the first shield 110. A member through which the light LL transmits may be provided in the through hole of the second shield 120.

In the atomic oscillator according to the sixth modification example, the second coil 70 is disposed outside the second shield 120. For example, it is conceivable to cover the atomic cell 30 with three shields in order to reduce an influence of an external magnetic field on the atomic cell 30, but in the atomic oscillator according to the sixth modification example, an outermost shield of the three shields may not be provided. Accordingly, in the atomic oscillator according to the sixth modification example, miniaturization and reduction in height can be achieved. Furthermore, in the atomic oscillator according to the sixth modification example, an assembly accuracy can be increased.

2. Frequency Signal Generation System

Figure 16:
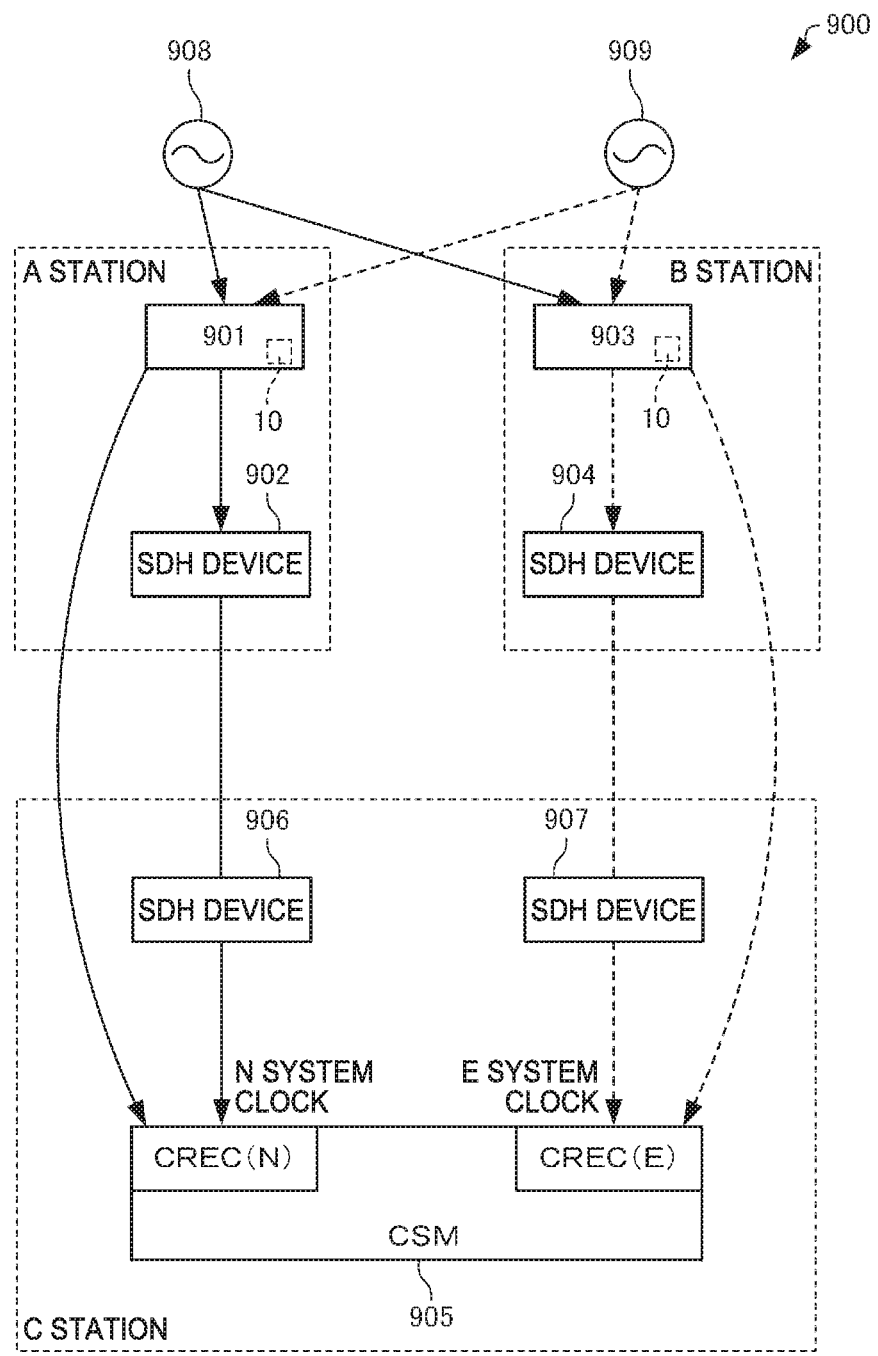
FIG. 16 is a schematic configuration diagram illustrating a frequency signal generation system according to the embodiment.

Next, a frequency signal generation system according to the present embodiment will be described with reference to the drawings. The following clock transmission system (timing server) is an example of the frequency signal generation system. FIG. 16 is a schematic configuration diagram illustrating the clock transmission system 900.

The clock transmission system according to the embodiment includes the atomic oscillator according to the embodiment. Hereinafter, the clock transmission system 900 including the atomic oscillator 100 will be described as an example.

The clock transmission system 900 matches clocks of each device in a time division multiplexing network and has a redundant configuration of a normal (N) system and an emergency (E) system.

As illustrated in FIG. 16, the clock transmission system 900 includes a clock supply device 901 and a synchronous digital hierarchy (SDH) device 902 in an A station (higher order (N system)), a clock supply device 903 and an SDH device 904 in a B station (higher order (E system)), and a clock supply device 905 and SDH devices 906 and 907 in a C station (lower order). The clock supply device 901 includes the atomic oscillator 100 and generates an N system clock signal. The atomic oscillator 100 in the clock supply device 901 generates a clock signal in synchronization with a more accurate clock signal from master clocks 908 and 909 including an atomic oscillator in which cesium is used.

The SDH device 902 transmits and receives a main signal, superimposes the N system clock signal onto the main signal, and transmits the superimposed signal to the clock supply device 905 of a lower order, based on the clock signal from the clock supply device 901. The clock supply device 903 includes the atomic oscillator 100 and generates an E system clock signal. The atomic oscillator 100 in the clock supply device 903 generates a clock signal in synchronization with a more accurate clock signal from the master clocks 908 and 909 including the atomic oscillator in which the cesium is used.

The SDH device 904 transmits and receives the main signal, superimposes the E system clock signal onto the main signal, and transmits the superimposed signal to the clock supply device 905 of the lower order, based on the clock signal from the clock supply device 903. The clock supply device 905 receives clock signals from the clock supply devices 901 and 903 and generates a clock signal in synchronization with the received clock signal.

The clock supply device 905 generates the clock signal normally in synchronization with the N system clock signal from the clock supply device 901. If an abnormality occurs in the N system, the clock supply device 905 generates the clock signal in synchronization with the E system clock signal from the clock supply device 903. In this way, by performing switching from the N system to the E system, a stable clock supply can be ensured and a reliability of a clock path network can be increased. The SDH device 906 transmits and receives the main signal, based on the clock signal from the clock supply device 905. Likewise, the SDH device 907 transmits and receives the main signal, based on the clock signal from the clock supply device 905. Thereby, it is possible to synchronize the device in the station C with the device in the station A or the station B.

The frequency signal generation system according to the present embodiment is not limited to the clock transmission system. The frequency signal generation system includes a system in which an atomic oscillator is mounted and which is configured with various devices and a plurality of devices that utilize a frequency signal of the atomic oscillator.

The frequency signal generation system according to the present embodiment may be, for example, a smart phone, a tablet terminal, a watch, a mobile phone, a digital still camera, a liquid ejecting device (for example, an ink jet printer), a personal computer, a television, a video camera, a video tape recorder, a car navigation device, a pager, an electronic notebook, an electronic dictionary, a calculator, an electronic game machine, a word processor, a work station, a video phone, a television monitor for security, an electronic binocular, a point of sales (POS) terminal, a medical device (for example, an electronic thermometer, a blood pressure meter, a blood glucose meter, an electrocardiogram measurement device, an ultrasonic diagnostic device, an electronic endoscope, a magnetocardiograph), a fish finder, a global navigation satellite system (GNSS) frequency standard instrument, various measurement instruments, instruments (for example, instruments of an automobile, an aircraft, and a ship), a flight simulator, a terrestrial digital broadcasting system, a mobile phone base station, and a moving object (an automobile, an aircraft, a ship, or the like).

The invention may omit a part of the configuration within a range having the characteristics and the effects described in the present application or may combine the respective embodiments and modification examples.

The invention includes substantially the same configuration as the configuration described in the embodiment (for example, a configuration having the same function, method, and result, or a configuration having the same object and effect). In addition, the invention includes a configuration in which a non-essential part of the configuration described in the embodiment is replaced. In addition, the invention includes a configuration that achieves the same operation effect as the configuration described in the embodiment, or a configuration that can achieve the same object. In addition, the invention includes a configuration in which a known technique is added to the configuration described in the embodiment.

What is claimed is:

1. An atomic oscillator comprising:
   a light source configured to emit light;
   an atomic cell in which alkali metal atoms are contained and on which the light emitted from the light source is incident;
   a first coil that applies a magnetic field to the atomic cell;
   a first shield that contains the atomic cell and the first coil and shields a magnetic field;
   a second shield that includes a first member having a recess and a second member, the second shield containing the light source and the first shield in a space which is formed by the first member and the second member, and the second shield shields a magnetic field; and
   a second coil that generates a magnetic field passing through an opening of the recess,
   wherein a coil opening of the second coil faces a bottom of the recess of the first member.

2. The atomic oscillator according to claim 1, wherein the second coil is disposed outside the first shield.

3. The atomic oscillator according to claim 1, wherein the second coil is disposed inside the second shield.

4. The atomic oscillator according to claim 2, wherein the second coil is disposed inside the second shield.

5. The atomic oscillator according to claim 1, further comprising:
   a multilayer substrate that is contained in the second shield,
   wherein the second coil is disposed in at least two layers of the multilayer substrate.

6. The atomic oscillator according to claim 1, wherein the second coil is disposed outside the second shield.

7. The atomic oscillator according to claim 1, further comprising:
   a magnetic sensor that is disposed inside the second coil and detects the magnetic field.

8. A magnetic field control method of an atomic oscillator, the atomic oscillator including
   a light source configured to emit light;
   an atomic cell in which alkali metal atoms are contained and on which the light emitted from the light source is incident;
   a first coil that applies a magnetic field to the atomic cell;
   a first shield that contains the atomic cell and the first coil and shields a magnetic field;
   a second shield that includes a first member having a recess and a second member, the second shield containing the light source and the first shield in a space which is formed by the first member and the second member, and the second shield shields a magnetic field; and
   a second coil that generates a magnetic field,
   the method comprising:
      generating the magnetic field passing through an opening of the recess by supplying a current to the second coil; and
      supplying a current to the first coil in a state where the magnetic field is generated by the second coil,
   wherein a coil opening of the second coil faces a bottom of the recess of the first member.

* * * * *